United States Patent [19]
Lin et al.

[11] Patent Number: 6,001,707
[45] Date of Patent: Dec. 14, 1999

[54] METHOD FOR FORMING SHALLOW TRENCH ISOLATION STRUCTURE

[75] Inventors: Chih-Hung Lin, Hsinchu; Gary Hong, Hsin-Chu, both of Taiwan

[73] Assignee: United Semiconductor Corp., Hsinchu, Taiwan

[21] Appl. No.: 09/241,760

[22] Filed: Feb. 1, 1999

[30]     Foreign Application Priority Data

Dec. 7, 1998 [TW]  Taiwan ................................. 87120246

[51] Int. Cl.$^6$ .................................................. H01L 21/76
[52] U.S. Cl. ........................ 438/433; 438/424; 438/426; 438/437; 438/444; 438/445; 438/447
[58] Field of Search ................................... 438/424, 425, 438/426, 433, 434, 437, 439, 444, 445, 447

[56]         References Cited

U.S. PATENT DOCUMENTS

| | | |
|---|---|---|
| 4,534,824 | 8/1985 | Chen ........................................ 156/628 |
| 5,447,883 | 9/1995 | Koyama . |
| 5,780,353 | 7/1998 | Omid-Zohoor .......................... 438/433 |
| 5,904,538 | 5/1999 | Son et al. .................................. 438/424 |

*Primary Examiner*—Wael Fahmy
*Assistant Examiner*—Long Pham
*Attorney, Agent, or Firm*—Jiawei Huang; J. C. Patents

[57]            ABSTRACT

A method for forming a shallow trench isolation structure in a substrate includes the steps of forming a doped region around the future top corner regions of a trench. The concentration of dopants inside the doped region increases towards the substrate surface. Thereafter, a trench is formed in the substrate, and then a thermal oxidation operation is carried out. Utilizing the higher oxidizing rate for doped substrate relative to an undoped region, the upper corners of the trench become rounded corners. Subsequently, a liner oxide layer is formed over the substrate surface inside the trench using conventional methods. Finally, insulating material is deposited into the trench to form a trench isolation structure.

20 Claims, 3 Drawing Sheets

METHOD FOR FORMING SHALLOW TRENCH ISOLATION STRUCTURE

CROSS-REFERENCE TO RELATED APPLICATION

This application claims the priority benefit of Taiwan application Ser. No. 87120246, filed Dec. 7, 1998, the full disclosure of which is incorporated herein by reference.

BACKGROUND OF THE INVENTION

1. Field of Invention

The present invention relates to a method for forming integrated circuit device. More particularly, the present invention relates to a method for forming a shallow trench isolation (STI) structure in a semiconductor substrate.

2. Description of Related Art

Device isolation regions are specially formed structures in a substrate for preventing carriers from moving between neighboring semiconductor devices. Normally, device isolation regions are formed within a dense semiconductor circuit region between neighboring field effect transistors (FETs) for reducing leakage current between them. Conventional isolation structure is a field oxide layer formed using a local oxidation of silicon (LOCOS) method. However, the field oxide layer produced by the LOCOS method often tends to accumulate internal stresses. Moreover, a bird's beak profile is formed close to the edge of the field oxide layer. The presence of a bird's beak near the edge of the field oxide layer makes device isolation almost impossible, especially when the device dimensions are small. Hence, in the fabrication of high-density circuits, field oxide structure is mostly replaced by a shallow trench isolation (STI) type of isolation structure.

Shallow trench isolation (STI) is one of the methods for forming device isolation structure in a semiconductor device. The method includes the steps of anisotropically etching a semiconductor substrate to form a trench, and then depositing insulating material to fill the trench. The STI structure has the advantage of being scaleable in addition to the capacity to avoid the bird's beak encroachment problem seen in conventional field oxide isolation. Therefore, STI is an ideal method for isolating sub-micron complementary MOS (CMOS) devices.

FIGS. 1A through 1D are schematic, cross-sectional views showing the progression of manufacturing steps according to a conventional method of forming a shallow trench isolation region in a substrate. First, as shown in FIG. 1A, a pad oxide layer 102 is formed over a silicon substrate 100 using a thermal oxidation method. Thereafter, a silicon nitride mask layer 104 is formed over the pad oxide layer 102.

Next, as illustrated in FIG. 1B, a photoresist layer (not shown) is deposited over the mask layer 104. Then, the mask layer 104, the pad oxide layer 102 and the silicon substrate 100 are etched in sequence to form a patterned mask layer 104a, a patterned pad oxide layer 102a and a trench 108 in the substrate 100. Subsequently, the photoresist layer is removed.

Next, as shown in FIG. 1C, high-temperature oxidation is conducted to form a liner oxide layer 110 on the exposed substrate surface of the trench 108. Thereafter, silicon oxide material is deposited into the trench 108, and then a chemical-mechanical polishing operation is carried out to remove the excess oxide material. Subsequently, the silicon nitride mask 104a is removed using hot phosphoric acid solution, and then the pad oxide layer 102a is removed using hydrofluoric (HF) acid solution. Finally, an isolation region 112 is formed in the substrate 100.

In the aforementioned method of fabricating a device isolation region, hydrofluoric acid solution is used to remove the pad oxide layer 102a in a wet etching operation. Since oxide material inside the trench 108 is more loosely deposited than the pad oxide layer 102a, the etching rate of oxide inside the trench 108 may be higher than that of the pad oxide layer 102a. Moreover, hydrofluoric acid solution is an isotropic etchant. Therefore, recess cavities 115 are easily formed at the top corner regions 114 of the trench 108, and hence the top corner regions 114 of the trench 108 are exposed.

The top corner region 114 of the trench 108 has rather sharp cross-sectional profile, as shown in FIG. 1D. Since a region with a sharp corner tends to slow the oxidation rate in a thermal oxidation operation, the corner regions 114 are covered with a thinner oxide layer when a gate oxide layer 116 is formed over the substrate 100. Uneven thickness in the gate oxide layer 116 later produces abnormal subthreshold voltage leading to the intensification of what is known as the kink effect.

In light of the foregoing, there is a need to improve the method of forming shallow trench isolation structure.

SUMMARY OF THE INVENTION

Accordingly, the purpose of the present invention is to provide a method for forming a shallow trench isolation structure such that the thickness of gate oxide deposited over the top corner regions of the trench is the same as the thickness of the gate oxide deposited elsewhere. Hence, the device can prevent the intensification of the kink effect.

To achieve these and other advantages and in accordance with the purpose of the invention, as embodied and broadly described herein, the invention provides a method for forming a shallow trench isolation (STI) region. The method includes the steps of sequentially forming a pad oxide layer, a mask layer and a cap layer over a substrate, and then patterning the cap layer and the mask layer. Dopants that can increase substrate oxidation rate are implanted into the substrate region outside the patterned cap layer and the mask layer to form a doped region. Thereafter, spacers are formed on the sidewalls of the patterned cap layer and the mask layer. A portion of the substrate is removed using the patterned cap layer and the spacers as a mask to form a trench in the substrate. Hence, the doped region surrounds the top corner regions of the trench. After that, a thermal oxidation is carried out to oxidize the doped region and the exposed substrate surface inside the trench, thereby forming an oxide layer. The oxidation rate in the doped region is larger than in the non-doped substrate region inside the trench. Moreover, concentration of the dopants within the doped region increases gradually towards the upper surface of the substrate. Hence, the oxide layer thickens as it approaches the top corners of the trench at the substrate surface. Afterwards, the cap layer, the spacers, a portion of the pad oxide layer, a portion of the oxidized doped region and a portion of the oxide layer above the substrate are removed. In the meantime, a rounded corner is formed at the top corners of the trench. Insulating material is deposited into the interior of the trench with rounded corners, and then the mask layer and the remaining pad oxide layer are removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
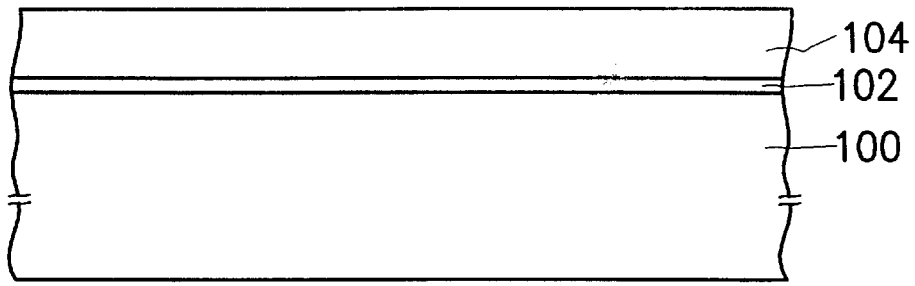
FIGS. 1A through 1D are schematic, cross-sectional views showing the progression of manufacturing steps according to a conventional method of forming a shallow trench isolation region in a substrate.
Figure 1B:
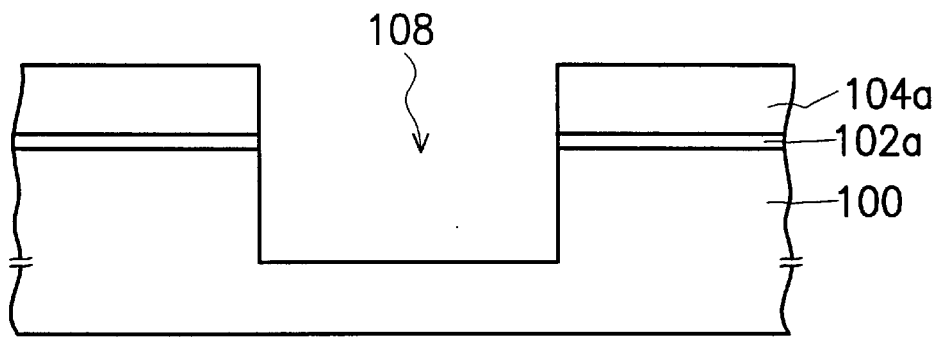
Figure 1C:
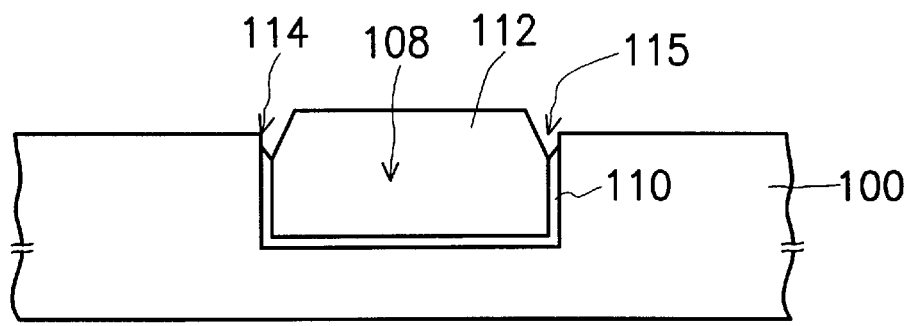
Figure 1D:
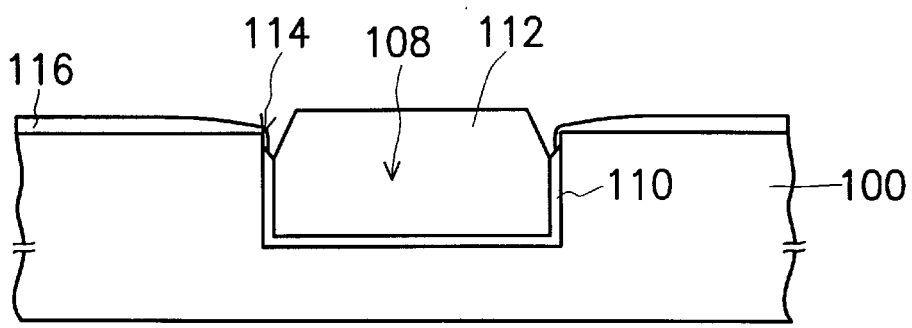

Reference will now be made in detail to the present preferred embodiments of the invention, examples of which are illustrated in the accompanying drawings. Wherever possible the same reference numbers are used in the drawings and the description to refer to the same or like parts.

FIGS. 2A through 2F are schematic, cross-sectional views showing the progression of manufacturing steps for forming a shallow trench isolation region in a substrate according to one preferred embodiment of this invention.

Figure 2A:
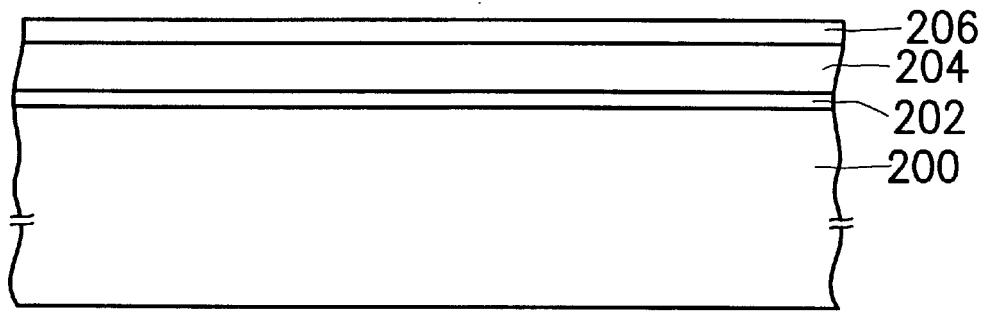
FIGS. 2A through 2F are schematic, cross-sectional views showing the progression of manufacturing steps for forming a shallow trench isolation region in a substrate according to one preferred embodiment of this invention.

As shown in FIG. 2A, a pad oxide layer 202 is formed over a substrate 200, which is, for example, a P-type silicon substrate. The pad oxide layer 202 is formed, for example, by performing thermal oxidation. The pad oxide layer 202 protects the substrate against damages while subsequent processing operations are carried out. Thereafter, a mask layer 204 is formed over the pad oxide layer 202. The mask layer 204 is formed from a material having an etching rate that differs from that of the substrate 200. The mask layer 204 is preferably a silicon nitride layer formed using a low-pressure chemical vapor deposition (LPCVD) method. In the subsequent step, a cap layer is formed over the mask layer 204. The cap layer 206 is formed from a material having an etching rate that differs from that of the substrate 200. The cap layer 206 is preferably a silicon oxide layer having a thickness of between 200 Å and 500 Å formed using, for example, a chemical vapor deposition (CVD) method.

Figure 2B:
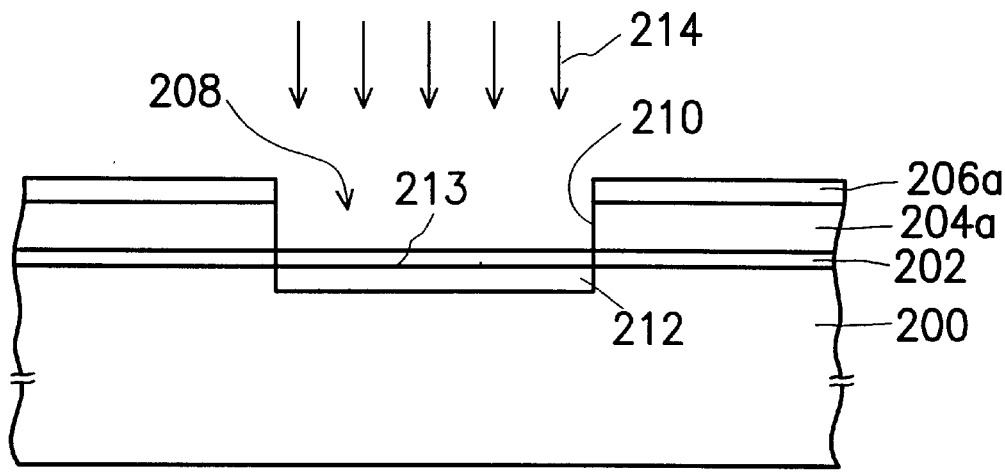

As shown in FIG. 2B, the cap layer 206 and the mask layer 204 are patterned to form a cap layer 206a and a mask layer 204a having an opening 208. A typical method of patterning the cap layer 206 and the mask layer 204 includes forming a patterned photoresist layer (not shown) over the cap layer 206. Then, the cap layer 206 and the mask layer 204 are etched in sequence using a dry etching method. Finally, the photoresist layer is removed.

Dopants are implanted into the regions of substrate 200 exposed by the cap layer 206a and the mask layer 204a, thereby forming a doped region 212 in the substrate 200. The dopants implanted into the doped region 212 are preferably n-type ions including, for example, arsenic or phosphorus. The dopants within the doped region 212 follow a concentration gradient that increases towards the upper surface 213 of the substrate 200. By adding dopants into the substrate, the rate of oxidation of the substrate in a thermal oxidation operation increases. The doped region 212 can be formed by carrying out an ion implantation 214 with the cap layer 206 serving as a mask. The dopants for carrying out the implantation 214 preferably have an energy level of between 20 KeV and 120 KeV and a dosage level of between $1 \times 10^{14}$ ions/cm$^2$ and $1 \times 10^{15}$ ions/cm$^2$.

Figure 2C:
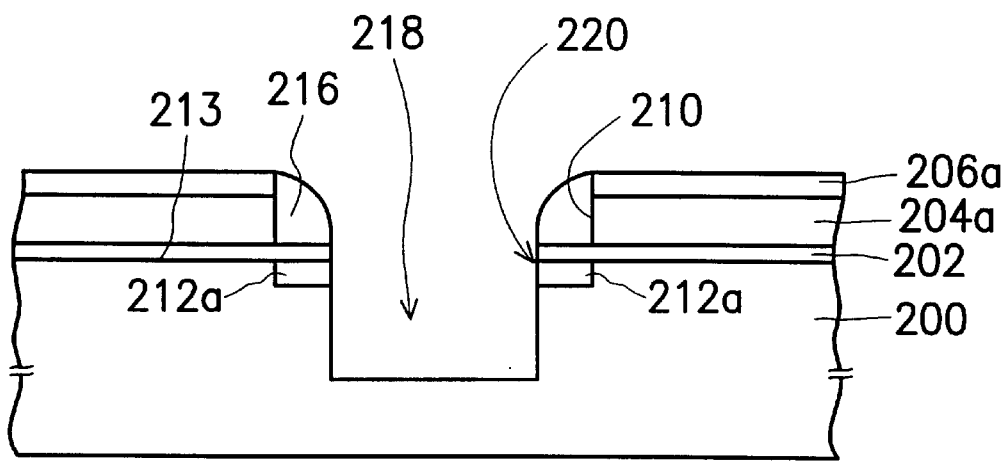

As shown in FIG. 2C, spacers 216 are formed on the sidewalls 210 of the cap layer 206a and the mask layer 204a. The spacers 216 are formed from a material having an etching rate that differs from the substrate 200. The spacers 216 can be formed by depositing a layer of silicon oxide of about 200 Å to 1000 Å in thickness over the entire substrate 200 and then etching back the silicon oxide layer. Thereafter, using the cap layer 206a and the spacers 216 as a mask, an etching operation is carried out to remove the pad oxide layer 202 on the bottom of the opening 208. Hence, the pad oxide layer 202 is turned into a pad oxide layer 202a. The etching operation continues after the exposed pad oxide layer 202 is removed. Ultimately, a trench 218 is formed in the substrate 200. In general, an anisotropic etching method is used to remove the exposed pad oxide and substrate material through the opening 208. However, a reactive ion etching (RIE) method is preferred.

In summary, the steps according to FIGS. 2A through 2C includes first forming doped region 212 around the future top corner regions 220 of the trench 218. Therefore, the top corner regions 220 of the trench are surrounded by a doped region 212a as soon as the trench 218 is formed.

Figure 2D:
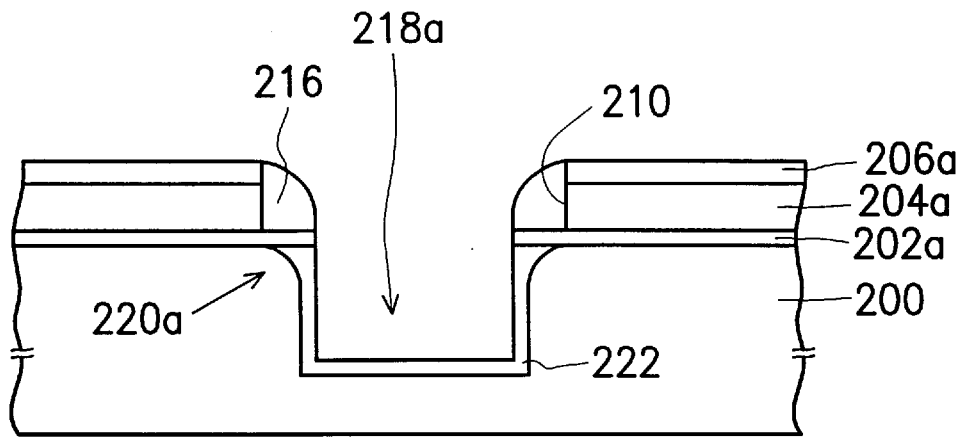

Thereafter, as shown in FIG. 2D, a thermal oxidation is carried out to oxidize the doped region 212a and a portion of the exposed substrate 200 within the trench 218. Ultimately, a silicon oxide layer 222 is formed within the trench 218. Since the rate of oxidation in the doped region 212a is higher than in other areas within the trench 218, the oxide layer 222 is thicker around the top corner regions 220 of the trench 218. Furthermore, due to the gradual increase of dopant concentration as the substrate surface 213 is approached, thickness of the oxide layer 222 correspondingly increases as it approaches the surface 213. Consequently, a trench 218a having rounded top corners 220a is formed. Preferably, the thermal operation is carried out in a furnace heated to a temperature of between 800° C. and 950° C. until the doped region 210a is completely oxidized.

Figure 2E:
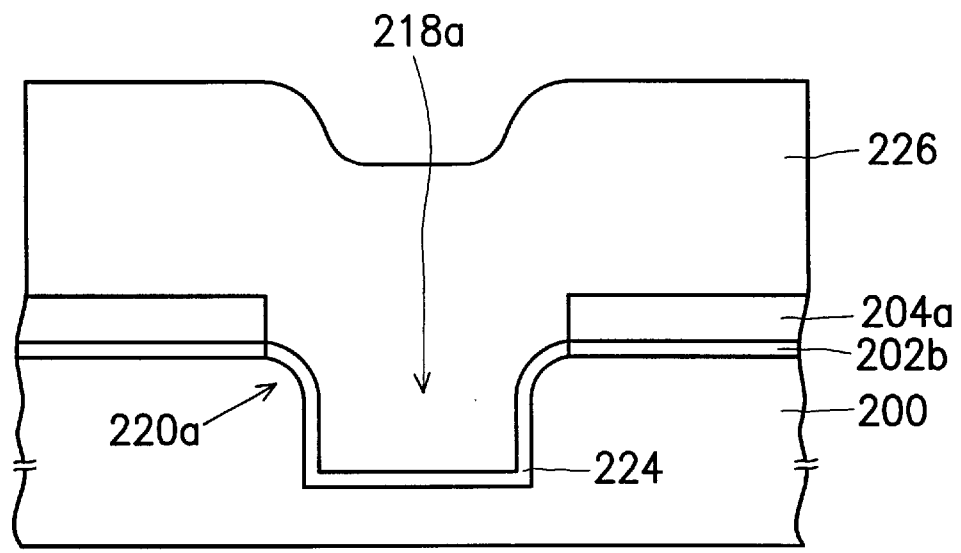

As shown in FIG. 2E, the cap layer 206a, the spacers 216, pad oxide layer 202a under the spacers 216 and the silicon oxide layer 222 are all removed. Hence, a pad oxide layer 202b is formed and exposes the rounded top corners 220a of the trench 218a. If the cap layer 206a and the spacers 216 are made from silicon oxide material, they are preferably removed using hydrofluoric acid solution. Thereafter, a liner oxide layer 224 is formed over the exposed substrate 200 of the trench 218a. The liner oxide layer 224 extends from the bottom part of the trench 218a up to and making contact with the pad oxide layer 202a.

A typical method of forming the liner oxide layer 224 includes performing a high-temperature thermal oxidation. Because the top corner regions 220a of the trench 218a are rounded into an arc, thickness of the liner oxide layer 224 at the top corner regions 220a and elsewhere in the interior of the trench 218a is the same. In the subsequent step, insulating material is deposited over the substrate and completely fills the trench 218a to form an insulation layer 226. The insulation layer 226 can be a silicon oxide layer formed, for example, by performing an atmospheric pressure chemical vapor deposition (APCVD) operation using tetra-ethylortho-silicate (TEOS) as a reactive gas. Thereafter, the insulation layer 226 can be densified at a temperature of about 1000° C. for between 10 and 30 minutes.

Figure 2F:
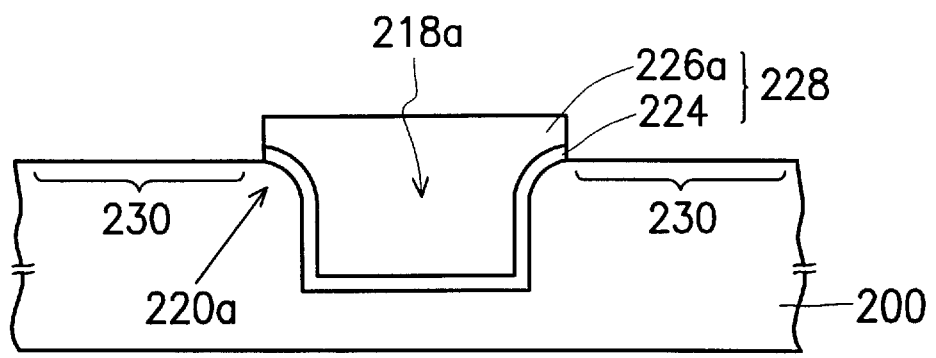

As shown in FIG. 2F, with the mask layer 204a serving as an etching stop layer, a portion of the insulation layer 226 is removed to form an insulation layer 226a having a planar surface. For example, a chemical-mechanical polishing operation can be applied to remove excess material above the mask layer 204a so that the insulation layer 226a and the liner oxide layer 224 remain within the trench 218a, only. Thereafter, the mask layer 204a and the pad oxide layer 202b are removed in sequence so that the insulation layer 226a and the liner oxide layer 224 together form an isolation structure 228.

For example, if the mask layer 204a is a silicon nitride layer, hot phosphoric acid solution is used in a wet etching operation to remove the mask layer 204a and expose the pad oxide layer 202a below. After that, hydrofluoric acid solution is used to remove the pad oxide layer 202a in an isotropic wet etching operation.

Since the top corner regions 220a of the trench 218a are rounded, thickness of an oxide layer formed in that region is almost the same as in the active region 230 elsewhere above the substrate 200. Hence, even if the top corner regions 220a of the trench 218a are exposed during the process of removing the pad oxide layer 202a or some other cleaning operations, a uniformly thick gate oxide layer can still be deposited over the substrate 200 in thermal oxidation.

In summary, major aspects of this invention include:

1. By forming a doped region around the top corners of the trench, rate of oxidation in that region can be increased. Hence, the top corner regions of the trench are rounded after performing a thermal oxidation.

2. The method of this invention is capable of forming a rounded top corner of a trench or an opening.

3. The method of this invention is capable of reducing the intensity of the kink effect on a device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming shallow trench isolation region, comprising the steps of:

providing a substrate;

forming a pad oxide layer over the substrate;

forming a mask layer over the pad oxide layer;

forming a cap layer over the mask layer;

patterning the cap layer and the mask layer;

forming a doped region in the substrate outside an area covered by the patterned cap layer and mask layer;

forming spacers on sidewalls of the patterned cap layer and the mask layer;

removing a portion of the pad oxide layer and a portion of the substrate, with the patterned cap layer and the spacers serving as a mask, to form a trench in the substrate;

performing a thermal oxidation operation so that the doped region and a portion of an exposed substrate within the trench are oxidized into an oxide layer, wherein a thickness of the oxide layer increases in an upward direction towards an upper surface of the substrate;

removing the cap layer, the spacers, a portion of the pad oxide layer and the oxide layer to expose a substrate surface inside the trench;

forming a liner oxide layer over the exposed substrate surface inside the trench;

depositing an insulating material into the trench; and removing the mask layer and the pad oxide layer.

2. The method of claim 1, wherein the cap layer is formed from a material having an etching rate that differs from that of the substrate.

3. The method of claim 1, wherein the doped region contains dopants that can increase the rate of oxidation of the substrate during oxidation.

4. The method of claim 3, wherein the dopants that can increase the rate of oxidation of the substrate include n-type dopants.

5. The method of claim 4, wherein the n-type dopants includes arsenic.

6. The method of claim 4, wherein the n-type dopants include phosphorus.

7. The method of claim 3, wherein a concentration of dopants in the doped region increases towards the substrate surface.

8. The method of claim 1, wherein the spacers are formed from material having an etching rate that differs from that of the substrate.

9. The method of claim 1, wherein the step of performing the thermal oxidation includes heating to a temperature of between 800° C. and 950° C.

10. The method of claim 1, wherein the step of removing the cap layer, the spacers, a portion of the pad oxide layer and the oxide layer includes using hydrofluoric acid in a wet etching operation.

11. A method for forming a rounded top corner of a trench, comprising the steps of:

providing a substrate;

forming a pad oxide layer over the substrate;

forming a mask layer over the pad oxide layer;

forming a cap layer over the mask layer;

patterning the cap layer and the mask layer;

forming a doped region in the substrate outside an area covered by the patterned cap layer and mask layer;

forming spacers on sidewalls of the patterned cap layer and the mask layer;

removing a portion of the pad oxide layer and a portion of the substrate using the patterned cap layer and the spacers as a mask to form a trench in the substrate;

performing a thermal oxidation operation so that the doped region and a portion of an exposed substrate within the trench are oxidized into an oxide layer, wherein a thickness of the oxide layer increases towards an upper surface of the substrate, and hence an upper corners of the trench become rounded corners due to the formation of the oxide layer; and removing the cap layer, the spacers, a portion of the pad oxide layer and the oxide layer.

12. The method of claim 11, wherein the cap layer is formed from a material having an etching rate that differs from that of the substrate.

13. The method of claim 11, wherein the doped region contains dopants that can increase the rate of oxidation of the substrate during oxidation.

14. The method of claim 13, wherein the dopants that can increase the rate of oxidation of the substrate include n-type dopants.

15. The method of claim 14, wherein the n-type dopants include arsenic.

16. The method of claim 14, wherein the n-type dopants include phosphorus.

17. The method of claim 13, wherein a concentration of dopants in the doped region increases towards the substrate surface.

18. The method of claim 11, wherein the spacers are formed from material having an etching rate that differs from that of the substrate.

19. The method of claim 11, wherein the step of performing the thermal oxidation includes heating to a temperature of between 800° C. and 950° C.

20. The method of claim 11, wherein the step of removing the cap layer, the spacers, a portion of the pad oxide layer and the oxide layer includes using hydrofluoric acid in a wet etching operation.

* * * * *